(12) United States Patent
Aisenbrey (10) Patent No.: US 7,829,006 B2
(45) Date of Patent: Nov. 9, 2010

(54) METHOD TO FORM VEHICLE COMPONENT DEVICES FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 1252 days.

(21) Appl. No.: 11/143,426

(22) Filed: Jun. 2, 2005

(65) Prior Publication Data

US 2005/0212162 A1 Sep. 29, 2005

Related U.S. Application Data

(63) Continuation-in-part of application No. 10/877,092, filed on Jun. 25, 2004, now abandoned, which is a continuation of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/577,993, filed on Jun. 8, 2004, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
*B29C 45/00* (2006.01)
*B29C 70/58* (2006.01)
(52) U.S. Cl. ............ 264/328.1; 264/328.6; 264/328.19
(58) Field of Classification Search ........................ None
See application file for complete search history.

(56) References Cited

U.S. PATENT DOCUMENTS

| 4,508,640 | A | * | 4/1985 | Kanda et al. | ................ 252/503 |
| 4,569,786 | A | * | 2/1986 | Deguchi | ...................... 252/503 |
| 5,567,296 | A | | 10/1996 | Luch | .......................... 205/158 |

(Continued)

FOREIGN PATENT DOCUMENTS

GB 2377449 A 7/2001

OTHER PUBLICATIONS

Co-pending U.S. Appl. No. 11/143,427, filed Jun. 2, 2005,"Low Cost Housings for Vehicle Mechanical Devices and Systems Manufactured From Conductive Loaded Resin-Based Materials", assigned to the same assignee.

*Primary Examiner*—Edmund H. Lee
(74) *Attorney, Agent, or Firm*—Douglas Schnabel (57) ABSTRACT

Automotive housings are formed of a conductive loaded resin-based material. The conductive loaded resin-based material comprises micron conductive powder(s), conductive fiber(s), or a combination of conductive powder and conductive fibers in a base resin host. The percentage by weight of the conductive powder(s), conductive fiber(s), or a combination thereof is between about 20% and 50% of the weight of the conductive loaded resin-based material. The micron conductive powders are metals or conductive non-metals or metal plated non-metals. The micron conductive fibers may be metal fiber or metal plated fiber. Further, the metal plated fiber may be formed by plating metal onto a metal fiber or by plating metal onto a non-metal fiber. Any platable fiber may be used as the core for a non-metal fiber. Superconductor metals may also be used as micron conductive fibers and/or as metal plating onto fibers in the present invention.

12 Claims, 9 Drawing Sheets

U.S. PATENT DOCUMENTS

| | | | |
|---|---|---|---|
| 5,630,387 A | 5/1997 | Kamiyama | 123/184.38 |
| 5,704,326 A | 1/1998 | Minegishi et al. | 123/184.53 |
| 6,189,492 B1 | 2/2001 | Brown | 123/41.49 |
| 2003/0131828 A1 | 7/2003 | Crary | 123/509 |
| 2003/0181568 A1 | 9/2003 | Amarasekera et al. | 524/495 |

* cited by examiner

METHOD TO FORM VEHICLE COMPONENT DEVICES FROM CONDUCTIVE LOADED RESIN-BASED MATERIALS

RELATED PATENT APPLICATIONS

This Patent Application is related to U.S. patent application Ser. No. 11/143,427, and filed on Jun. 2, 2005, now abandoned, which is herein incorporated by reference in its entirety.

This Patent Application claims priority to the U.S. Provisional Patent Application 60/577,993, filed on Jun. 8, 2004, which is herein incorporated by reference in its entirety.

This Patent application is a Continuation-in-Part of U.S. patent application Ser. No. 10/877,092, filed on Jun. 25, 2004, which is a Continuation of U.S. patent application Ser. No. 10/309,429, filed on Dec. 4, 2002, now issued as U.S. Pat. No. 6,870,516, also incorporated by reference in its entirety, which is a Continuation-in-Part application of U.S. patent application Ser. No. 10/075,778, filed on Feb. 14, 2002, now issued as U.S. Pat. No. 6,741,221, which claimed priority to US Provisional Patent Application Ser. Nos. 60/317,808, filed on Sep. 7, 2001, Ser. No. 60/269,414, filed on Feb. 16, 2001, and Ser. No. 60/268,822, filed on Feb. 15, 2001, all of which are incorporated by reference in their entirety.

BACKGROUND OF THE INVENTION (1) Field of the Invention

This invention relates to automotive housings and, more particularly, to automotive housings molded of conductive loaded resin-based materials comprising micron conductive powders, micron conductive fibers, or a combination thereof, substantially homogenized within a base resin when molded. This manufacturing process yields a conductive part or material usable within the EMF, thermal, acoustic, or electronic spectrum(s).

(2) Description of the Prior Art

Automotive vehicles are constructed from a set of operating systems such as engine, transmission, differential, and the like. Systems typically comprise a set of internal operating parts that are housed in a cover, case, or housing. For example, a transmission has a casing that provides support, protection, and heat transfer for the various internal gears and fluids. Automotive cases, housings, and covers are typically constructed of metal, such as iron, steel, or aluminum. In some situation, the cases are partially or completed constructed of plastic or composite materials. Metal cases typically are heavier and more expensive to manufacture. Plastic cases are lighter and less costly to manufacture but have serious limitations due to poor thermal and electrical conductivity. A primary objective of the present invention is to construct various automotive cases, housings, and covers from a unique material that provides excellent thermal and electrical conductivity combined with the ease of manufacture of a moldable part.

Several prior art inventions relate to automotive housings and casings. U.S. Pat. No. 5,630,387 to Kamiyama teaches an intake manifold having increased crash-compaction manufactured in part of a resin based material. U.S. Pat. No. 6,189,492 B1 to Brown teaches an automotive fan shroud that is integrally formed with liquid reservoirs made of plastics resin. This invention also teaches the use of a reinforced polypropylene resin that is reinforced with approximately 40% talcum powder to improve its strength and rigidity. U.S. Pat. No. 5,704,326 to Minegishi et al teaches an air induction system for an internal combustion engine that utilizes air flow bodies and a collector body formed of a molded resin material. U.S. Patent Publication U.S. 2003/0131828 A1 to Crary teaches an in-tank fuel module inlet strainer with ESD protection where most of the module components such as the reservoir, motor/pump sleeve, regulator receptacle and filter housing are rendered conductive through the use of metal fibers or carbon powder in the polymeric matrix. U.S. Patent Publication U.S. 2003/0181568 A1 to Amarasekera et al teaches the use of conductive plastic compositions for electromagnetic shielding, electrostatic dissipation or antistatic purposes in packaging, electronic components, housings for electronic components and automotive housings. This also teaches the use of small carbon fibers and either carbon powder or fibrous non-conductive fillers or a combination of both in the polymeric resin matrix. U.S. Pat. No. 5,567,296 to Luch teaches a composite fuel tank comprising layers of polymer and metal joined together in a secure laminated structure. This also teaches an electroplating capable resin having a polymer matrix consisting of carbon black and sulfur.

SUMMARY OF THE INVENTION

A principal object of the present invention is to provide an effective automotive component housing, case, or cover.

A further object of the present invention is to provide a method to form an automotive housing, case, or cover.

A yet further object of the present invention is to provide an automotive housing, case, or cover molded of conductive loaded resin-based material where the thermal or electrical characteristics can be altered or the visual characteristics can be altered by forming a metal layer over the conductive loaded resin-based material.

A further object of the present invention is to provide automotive housings, cases, and covers having reduced weight.

A further object of the present invention is to provide automotive housings, cases, and covers having reduced manufacturing cost.

A further object of the present invention is to provide automotive housings, cases, and covers having excellent thermal and electrical conductivity.

In accordance with the objects of this invention, a vehicle component device is achieved. The device comprises a mechanical apparatus and a housing surrounding the mechanical apparatus. The housing comprises a conductive loaded, resin-based material comprising conductive materials in a base resin host.

Also in accordance with the objects of this invention, a vehicle component device is achieved. The device comprises a mechanical apparatus and a housing surrounding the mechanical apparatus. The housing comprises a conductive loaded, resin-based material comprising conductive materials in a base resin host. The percent by weight of the conductive materials is between about 20% and about 50% of the total weight of the conductive loaded resin-based material.

Also in accordance with the objects of this invention, a vehicle component device is achieved. The device comprises a mechanical apparatus and a housing surrounding the mechanical apparatus. The housing comprises a conductive loaded, resin-based material comprising micron conductive fiber in a base resin host. The percent by weight of the micron conductive fiber is between about 20% and about 50% of the total weight of the conductive loaded resin-based material.

Also in accordance with the objects of this invention, a method to form a vehicle component device is achieved. The method comprises providing a conductive loaded, resin-based material comprising conductive materials in a resin-based host. The conductive loaded, resin-based material is molded into a vehicle component device. The device comprises a mechanical apparatus and a housing surrounding the mechanical apparatus. The housing comprises the conductive loaded resin-based material.

Also in accordance with the objects of this invention, a method to form a vehicle component device is achieved. The method comprises providing a conductive loaded, resin-based material comprising conductive materials in a resin-based host. The percent by weight of the conductive materials is between 20% and 40% of the total weight of the conductive loaded resin-based material. The conductive loaded, resin-based material is molded into a vehicle component device comprising a mechanical apparatus and a housing surrounding the mechanical apparatus. The housing comprises the conductive loaded resin-based material.

Also in accordance with the objects of this invention, a method to form a vehicle component device is achieved. The method comprises providing a conductive loaded, resin-based material comprising micron conductive fiber in a resin-based host. The percent by weight of the micron conductive fiber is between 20% and 50% of the total weight of the conductive loaded resin-based material. The conductive loaded, resin-based material into a vehicle component device comprises a mechanical apparatus and a housing surrounding the mechanical apparatus. The housing comprises the conductive loaded resin-based material.

BRIEF DESCRIPTION OF THE DRAWINGS

In the accompanying drawings forming a material part of this description, there is shown.

DESCRIPTION OF THE PREFERRED EMBODIMENTS

This invention relates to automotive housings molded of conductive loaded resin-based materials comprising micron conductive powders, micron conductive fibers, or a combination thereof, substantially homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are substantially homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of automotive housings fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the automotive housings are substantially homogenized together using molding techniques and or methods such as injection molding, over-molding, insert molding, thermo-set, protrusion, extrusion, calendaring, or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

In the conductive loaded resin-based material, electrons travel from point to point when under stress, following the path of least resistance. Most resin-based materials are insulators and represent a high resistance to electron passage. The doping of the conductive loading into the resin-based material alters the inherent resistance of the polymers. At a threshold concentration of conductive loading, the resistance through the combined mass is lowered enough to allow electron movement. Speed of electron movement depends on conductive loading concentration, that is, the separation between the conductive loading particles. Increasing conductive loading content reduces interparticle separation distance, and, at a critical distance known as the percolation point, resistance decreases dramatically and electrons move rapidly.

Resistivity is a material property that depends on the atomic bonding and on the microstructure of the material. The atomic microstructure material properties within the conductive loaded resin-based material are altered when molded into a structure. A substantially homogenized conductive microstructure of delocalized valance electrons is created. This microstructure provides sufficient charge carriers within the molded matrix structure. As a result, a low density, low resistivity, lightweight, durable, resin based polymer microstructure material is achieved. This material exhibits conductivity comparable to that of highly conductive metals such as silver, copper or aluminum, while maintaining the superior structural characteristics found in many plastics and rubbers or other structural resin based materials.

The use of conductive loaded resin-based materials in the fabrication of automotive housings significantly lowers the cost of materials and the design and manufacturing processes used to hold ease of close tolerances, by forming these materials into desired shapes and sizes. The automotive housings can be manufactured into infinite shapes and sizes using conventional forming methods such as injection molding, over-molding, or extrusion, calendaring, or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or any combination thereof, which are substantially homogenized together within the base resin, during the molding process, yielding an easy to produce low cost, electrically conductive, close tolerance manufactured part or circuit. The resulting molded article comprises a three dimensional, continuous network of conductive loading and polymer matrix. Exemplary micron conductive powders include carbons, graphites, amines or the like, and/or of metal powders such as nickel, copper, silver, aluminum, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The addition of conductive powder to the micron conductive fiber loading may increase the surface conductivity of the molded part, particularly in areas where a skinning effect occurs during molding.

The micron conductive fibers may be metal fiber or metal plated fiber. Further, the metal plated fiber may be formed by plating metal onto a metal fiber or by plating metal onto a non-metal fiber. Exemplary metal fibers include, but are not limited to, stainless steel fiber, copper fiber, nickel fiber, silver fiber, aluminum fiber, or the like, or combinations thereof. Exemplary metal plating materials include, but are not limited to, copper, nickel, cobalt, silver, gold, palladium, platinum, ruthenium, and rhodium, and alloys of thereof. Any platable fiber may be used as the core for a non-metal fiber. Exemplary non-metal fibers include, but are not limited to, carbon, graphite, polyester, basalt, man-made and naturally-occurring materials, and the like. In addition, superconductor metals, such as titanium, nickel, niobium, and zirconium, and alloys of titanium, nickel, niobium, and zirconium may also be used as micron conductive fibers and/or as metal plating onto fibers in the present invention.

The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion, or calendaring, to create desired shapes and sizes. The molded conductive loaded resin-based materials can also be stamped, cut or milled as desired to form create the desired shape form factor(s) of the automotive housings. The doping composition and directionality associated with the micron conductors within the loaded base resins can affect the electrical and structural characteristics of the automotive housings and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming automotive housings of resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in automotive housings applications as described herein.

The substantially homogeneous mixing of micron conductive fiber and/or micron conductive powder and base resin described in the present invention may also be described as doping. That is, the substantially homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the substantially homogeneous mixing of micron conductive fiber and/or micron conductive powder into a base resin.

As an additional and important feature of the present invention, the molded conductor loaded resin-based material exhibits excellent thermal dissipation characteristics. Therefore, automotive housings manufactured from the molded conductor loaded resin-based material can provide added thermal dissipation capabilities to the application. For example, heat can be dissipated from electrical devices physically and/or electrically connected to automotive housings of the present invention.

As a significant advantage of the present invention, automotive housings constructed of the conductive loaded resin-based material can be easily interfaced to an electrical circuit or grounded. In one embodiment, a wire can be attached to a conductive loaded resin-based automotive housing via a screw that is fastened to the automotive housings. For example, a simple sheet-metal type, self tapping screw, when fastened to the material, can achieve excellent electrical connectivity via the conductive matrix of the conductive loaded resin-based material. To facilitate this approach a boss may be molded into the conductive loaded resin-based material to accommodate such a screw. Alternatively, if a solderable screw material, such as copper, is used, then a wire can be soldered to the screw that is embedded into the conductive loaded resin-based material. In another embodiment, the conductive loaded resin-based material is partly or completely plated with a metal layer. The metal layer forms excellent electrical conductivity with the conductive matrix. A connection of this metal layer to another circuit or to ground is then made. For example, if the metal layer is solderable, then a soldered connection may be made between the automotive housings and a grounding wire.

Where a metal layer is formed over the surface of the conductive loaded resin-based material, any of several techniques may be used to form this metal layer. This metal layer may be used for visual enhancement of the molded conductive loaded resin-based material article or to otherwise alter performance properties. Well-known techniques, such as electroless metal plating, electro metal plating, metal vapor deposition, metallic painting, or the like, may be applied to the formation of this metal layer. If metal plating is used, then the resin-based structural material of the conductive loaded, resin-based material is one that can be metal plated. There are many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated. Electroless plating is typically a multiple-stage chemical process where, for example, a thin copper layer is first deposited to form a conductive layer. This conductive layer is then used as an electrode for the subsequent plating of a thicker metal layer.

A typical metal deposition process for forming a metal layer onto the conductive loaded resin-based material is vacuum metallization. Vacuum metallization is the process where a metal layer, such as aluminum, is deposited on the conductive loaded resin-based material inside a vacuum chamber. In a metallic painting process, metal particles, such as silver, copper, or nickel, or the like, are dispersed in an acrylic, vinyl, epoxy, or urethane binder. Most resin-based materials accept and hold paint well, and automatic spraying systems apply coating with consistency. In addition, the excellent conductivity of the conductive loaded resin-based material of the present invention facilitates the use of extremely efficient, electrostatic painting techniques.

The conductive loaded resin-based material can be contacted in any of several ways. In one embodiment, a pin is embedded into the conductive loaded resin-based material by insert molding, ultrasonic welding, pressing, or other means. A connection with a metal wire can easily be made to this pin and results in excellent contact to the conductive loaded resin-based material. In another embodiment, a hole is formed in to the conductive loaded resin-based material either during the molding process or by a subsequent process step such as drilling, punching, or the like. A pin is then placed into the hole and is then ultrasonically welded to form a permanent mechanical and electrical contact. In yet another embodiment, a pin or a wire is soldered to the conductive loaded resin-based material. In this case, a hole is formed in the conductive loaded resin-based material either during the molding operation or by drilling, stamping, punching, or the like. A solderable layer is then formed in the hole. The solderable layer is preferably formed by metal plating. A conductor is placed into the hole and then mechanically and electrically bonded by point, wave, or reflow soldering.

Another method to provide connectivity to the conductive loaded resin-based material is through the application of a solderable ink film to the surface. One exemplary solderable ink is a combination of copper and solder particles in an epoxy resin binder. The resulting mixture is an active, screen-printable and dispensable material. During curing, the solder reflows to coat and to connect the copper particles and to thereby form a cured surface that is directly solderable without the need for additional plating or other processing steps. Any solderable material may then be mechanically and/or electrically attached, via soldering, to the conductive loaded resin-based material at the location of the applied solderable ink. Many other types of solderable inks can be used to provide this solderable surface onto the conductive loaded resin-based material of the present invention. Another exemplary embodiment of a solderable ink is a mixture of one or more metal powder systems with a reactive organic medium. This type of ink material is converted to solderable pure metal during a low temperature cure without any organic binders or alloying elements.

A ferromagnetic conductive loaded resin-based material may be formed of the present invention to create a magnetic or magnetizable form of the material. Ferromagnetic micron conductive fibers and/or ferromagnetic conductive powders are mixed with the base resin. Ferrite materials and/or rare earth magnetic materials are added as a conductive loading to the base resin. With the substantially homogeneous mixing of the ferromagnetic micron conductive fibers and/or micron conductive powders, the ferromagnetic conductive loaded resin-based material is able to produce an excellent low cost, low weight magnetize-able item. The magnets and magnetic devices of the present invention can be magnetized during or after the molding process. The magnetic strength of the magnets and magnetic devices can be varied by adjusting the amount of ferromagnetic micron conductive fibers and/or ferromagnetic micron conductive powders that are incorporated with the base resin. By increasing the amount of the ferromagnetic doping, the strength of the magnet or magnetic devices is increased. The substantially homogenous mixing of the conductive fiber network allows for a substantial amount of fiber to be added to the base resin without causing the structural integrity of the item to decline. The ferromagnetic conductive loaded resin-based magnets display the excellent physical properties of the base resin, including flexibility, moldability, strength, and resistance to environmental corrosion, along with excellent magnetic ability. In addition, the unique ferromagnetic conductive loaded resin-based material facilitates formation of items that exhibit excellent thermal and electrical conductivity as well as magnetism.

A high aspect ratio magnet is easily achieved through the use of ferromagnetic conductive micron fiber or through the combination of ferromagnetic micron powder with conductive micron fiber. The use of micron conductive fiber allows for molding articles with a high aspect ratio of conductive fiber to cross sectional area. If a ferromagnetic micron fiber is used, then this high aspect ratio translates into a high quality magnetic article. Alternatively, if a ferromagnetic micron powder is combined with micron conductive fiber, then the magnetic effect of the powder is effectively spread throughout the molded article via the network of conductive fiber such that an effective high aspect ratio molded magnetic article is achieved. The ferromagnetic conductive loaded resin-based material may be magnetized, after molding, by exposing the molded article to a strong magnetic field. Alternatively, a strong magnetic field may be used to magnetize the ferromagnetic conductive loaded resin-based material during the molding process.

The ferromagnetic conductive loading is in the form of fiber, powder, or a combination of fiber and powder. The micron conductive powder may be metal fiber or metal plated fiber. If metal plated fiber is used, then the core fiber is a platable material and may be metal or non-metal. Exemplary ferromagnetic conductive fiber materials include ferrite, or ceramic, materials as nickel zinc, manganese zinc, and combinations of iron, boron, and strontium, and the like. In addition, rare earth elements, such as neodymium and samarium, typified by neodymium-iron-boron, samarium-cobalt, and the like, are useful ferromagnetic conductive fiber materials. Exemplary ferromagnetic micron powder leached onto the conductive fibers include ferrite, or ceramic, materials as nickel zinc, manganese zinc, and combinations of iron, boron, and strontium, and the like. In addition, rare earth elements, such as neodymium and samarium, typified by neodymium-iron-boron, samarium-cobalt, and the like, are useful ferromagnetic conductive powder materials. A ferromagnetic conductive loading may be combined with a non-ferromagnetic conductive loading to form a conductive loaded resin-based material that combines excellent conductive qualities with magnetic capabilities.

Figure 1A:
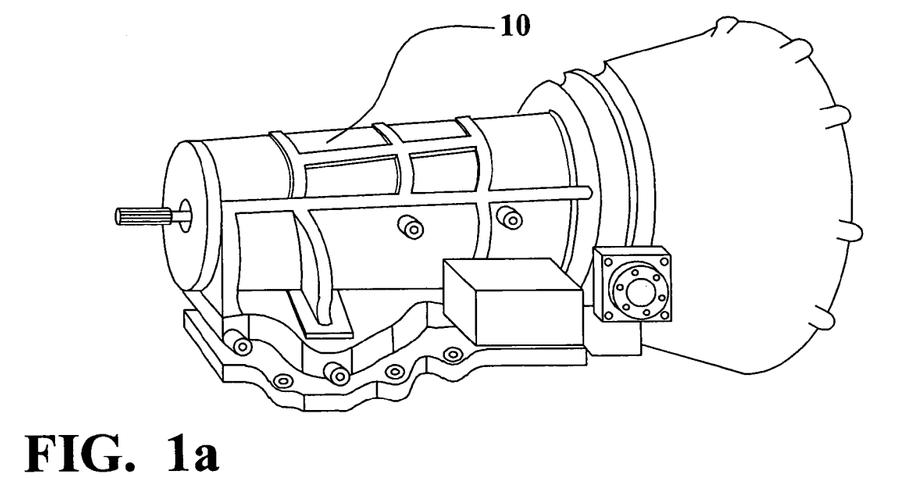
FIG. 1a illustrates a first preferred embodiment of the present invention showing an exemplary housing formed of conductive loaded resin-based material and, more particularly, illustrates an automotive transmission case.

Referring now to FIG. 1a, a first preferred embodiment of the present invention is illustrated. A low cost housing 10 for vehicle mechanical devices and systems is shown. While this figure depicts a transmission case it is also representative of the many housings which can be formed of conductive loaded resin-based material for use in covering and/or encasing vehicle mechanical devices and systems. Examples of the vehicle housings 10 represented by FIG. 1a include, but are not limited to, alternator housing, air conditioner compressor housing, starter case, water pump housing, oil pump housing, differential housing, and transmission case.

The conductive loaded resin-based material housing 10 illustrated in FIG. 1a provides advantages over conventional metal housings because of the significant weight savings it provides. This weight savings translates to significant advantages in vehicle performance, particularly with respect to fuel efficiency. This is important both in meeting governmental fuel efficiency ratings as well as in providing high consumer satisfaction. A further advantage of the conductive loaded resin-based material housing 10 illustrated in FIG. 1a is the economics of fabricating such a housing. As previously mentioned, conductive loaded resin-based material is readily molded, milled, and otherwise formed to close tolerances by those skilled in the art. Conductive loaded resin-based material is molded into almost any size and shape that the particular housing application requires.

Figure 1B:
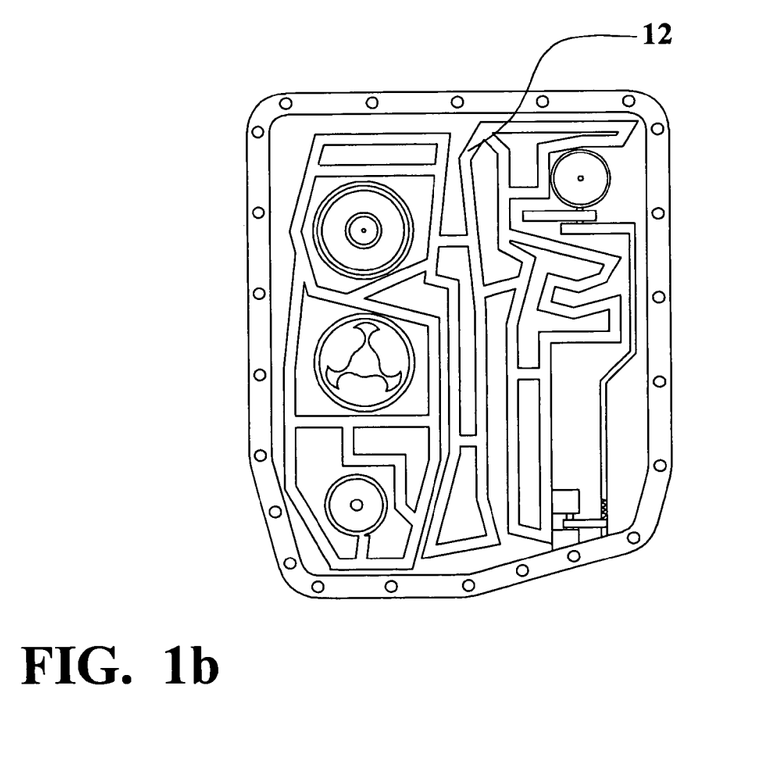
FIG. 1b illustrates a second preferred embodiment of the present invention showing the inner shell of a transmission case wherein the housing and inner passageways for routing fluid are formed of conductive loaded resin-based material.

Referring now to FIG. 1b, a second preferred embodiment of the present invention is illustrated. The conductive loaded resin-based material of the present invention is appropriate not only for fabricating the outer shell of the transmission case 10, as in FIG. 1b, but also for molding the intricate passageways 12 which route fluid to the various components of the transmission as shown in FIG. 1b. This results in a lower cost finished product as compared to the metal housings commonly found in industry. The base resin and the conductive materials used for doping are selected in order to provide the desired properties for each specific housing application. Conductive loaded resin-based materials of the present invention thereby provide the appropriate temperature, chemical resistance, strength, corrosion resistance, and flame-retardant properties required for vehicle housing applications.

Conductive loaded resin-based material housings 10 of the present invention also provide thermal dissipation benefits. When homogeneously loaded with thermally conductive materials, the conductive loaded resin-based material housing is able to transmit heat away from high temperature devices or systems. This is advantageous to the optimum operation of the vehicle. Because the conductive loaded resin-based material of the present invention is electrically conductive, housings comprising this material are useful as an electrical ground in applications where grounding is advantageous. Conductive loaded resin-based material housings 10 of the present invention are also capable of accepting metallic plating, not shown, which may be desirable in some situations for visual purposes. Plating alters the thermal characteristics of the conductive loaded resin-based material housing. Plating materials are therefore selected with attention to the thermal requirements of the particular application.

As a significant advantage of the present invention, automotive housings or covers constructed of the conductive loaded resin-based material can be easily interfaced to an electrical circuit or grounded. In one embodiment, a wire can be attached to a conductive loaded resin-based housing or cover via a screw that is fastened to the housing. For example, a simple sheet-metal type, self tapping screw can, when fastened to the housing, achieve excellent electrical connectivity via the conductive matrix of the conductive loaded resin-based material. To facilitate this approach a boss may be molded into the conductive loaded resin-based material to accommodate such a screw. Alternatively, if a solderable screw material, such as copper, is used, then a wire can be soldered to the screw is embedded into the conductive loaded resin-based material. In another embodiment, the conductive loaded resin-based material is partly or completely plated with a metal layer. The metal layer forms excellent electrical conductivity with the conductive matrix. A connection of this metal layer to another circuit or to ground is then made. For example, if the metal layer is solderable, then a soldered connection may be made between the housing and a grounding wire.

Figure 1C:
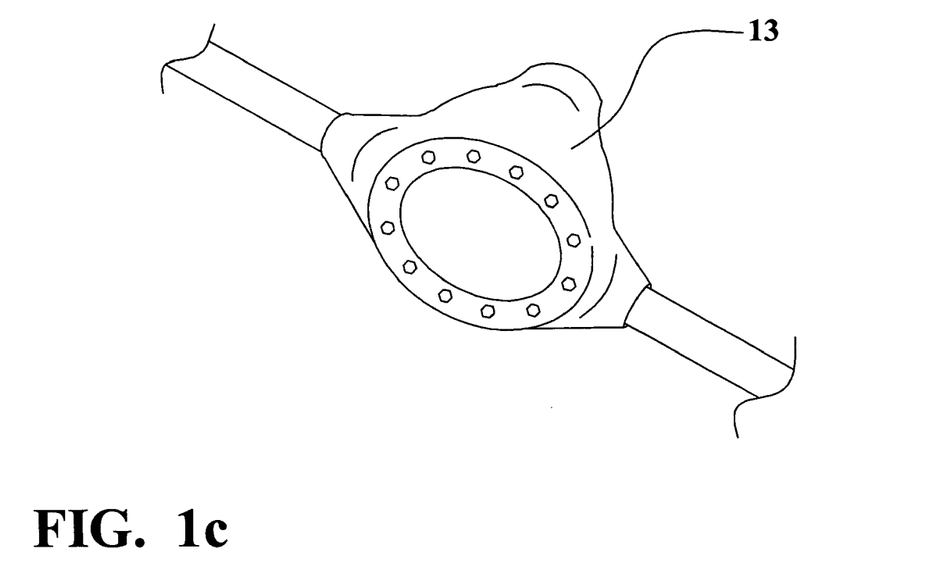
FIG. 1c illustrates a third preferred embodiment of the present invention showing a rear differential housing formed of conductive loaded resin-based material.
Figure 1D:
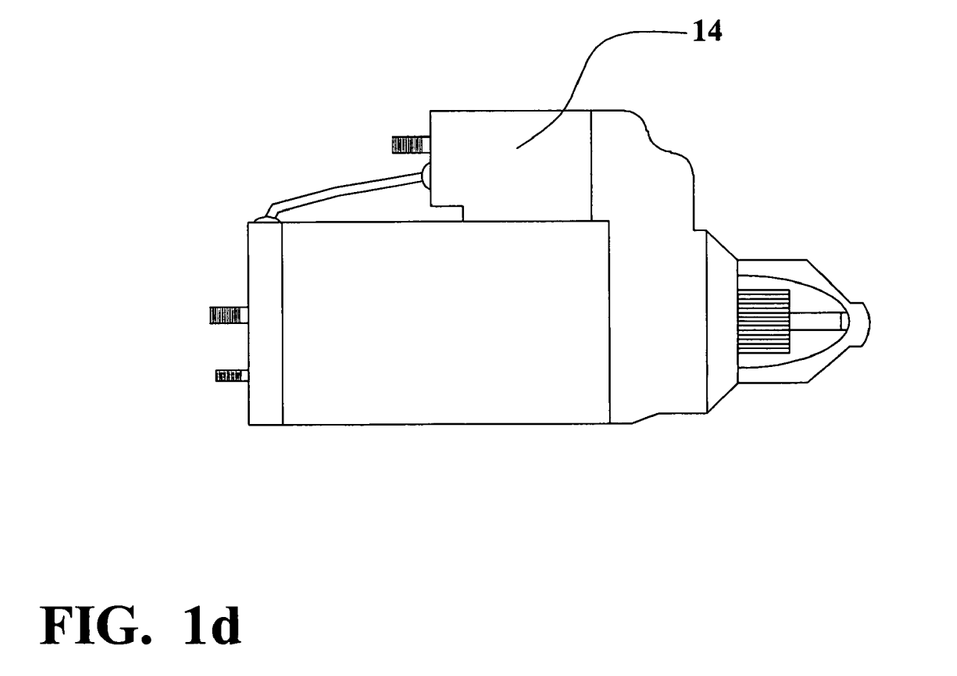
FIG. 1d illustrates a fourth preferred embodiment of the present invention showing an exemplary vehicle starter housing formed of conductive loaded resin-based material.
Figure 1E:
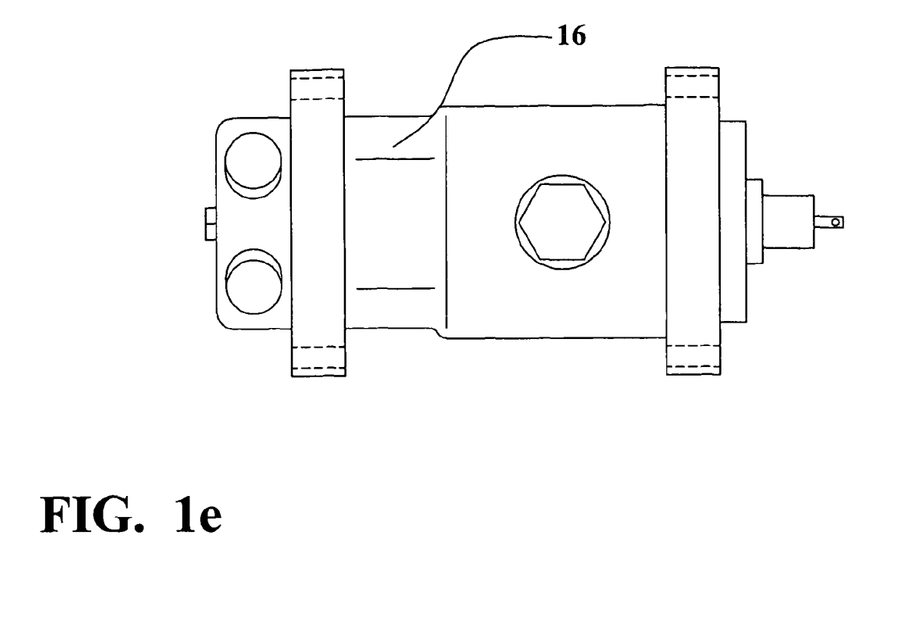
FIG. 1e illustrates a fifth preferred embodiment of the present invention showing an exemplary air conditioner compressor housing formed of conductive loaded resin-based material.
Figure 1F:
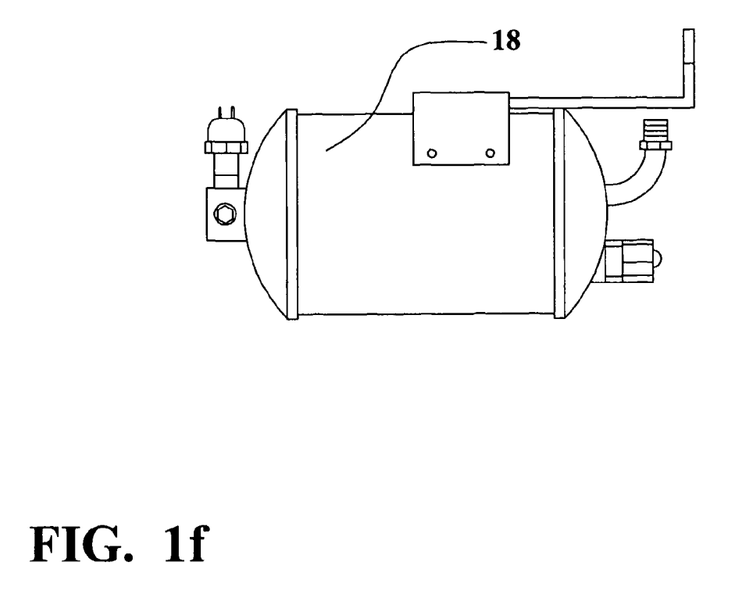
FIG. 1f illustrates a sixth preferred embodiment of the present invention showing an exemplary air conditioner dryer housing formed of conductive loaded resin-based material.
Figure 1G:
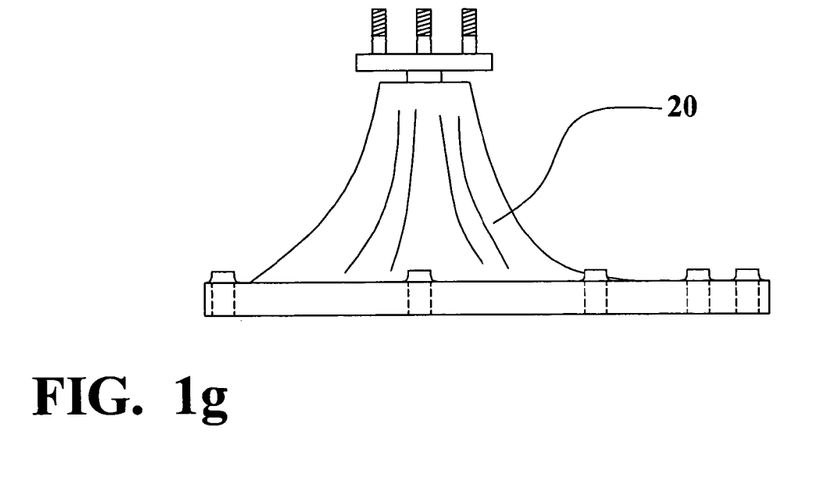
FIG. 1g illustrates a seventh preferred embodiment of the present invention showing an exemplary water pump housing formed of conductive loaded resin-based material.
Figure 1H:
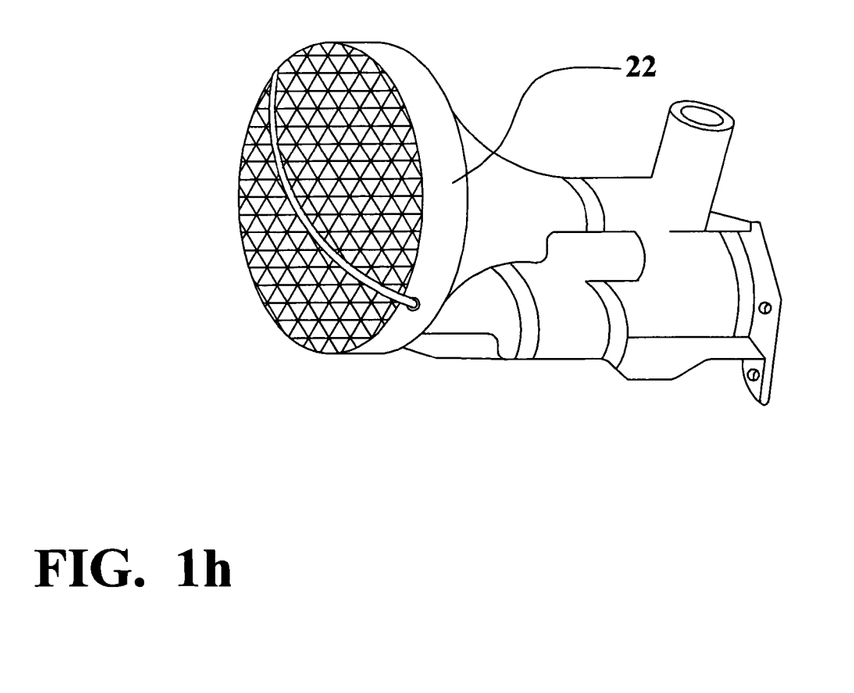
FIG. 1h illustrates an eighth preferred embodiment of the present invention showing an exemplary oil pump housing formed of conductive loaded resin-based material.
Figure 1I:
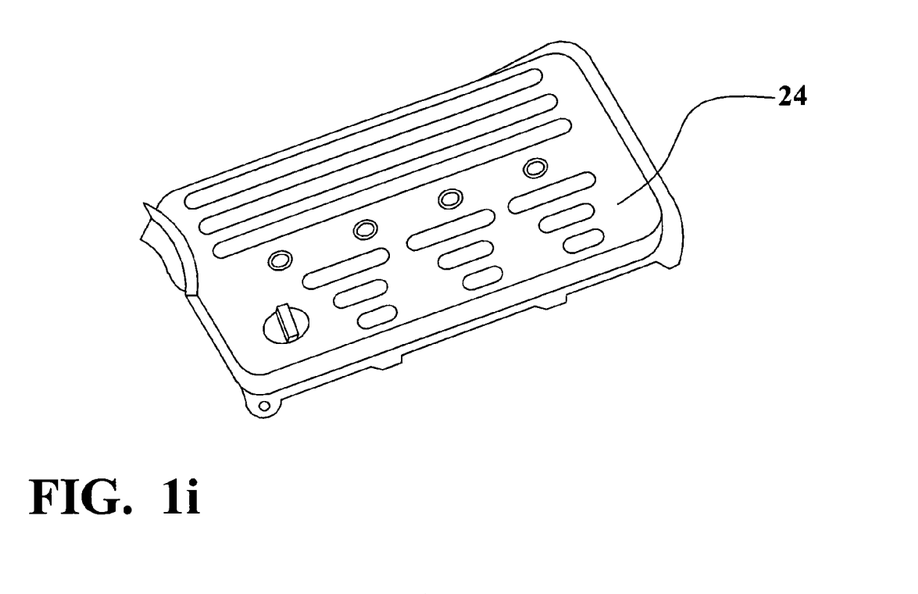
FIG. 1i illustrates a ninth preferred embodiment of the present invention showing valve covers formed of conductive loaded resin-based material.

Referring now to FIGS. 1c, 1d, 1e, 1f, 1g, 1h and 1i, third through ninth preferred embodiments of the present invention are illustrated. Each embodiment illustrates a different type of automotive housing and cover comprising conductive loaded resin-based material. FIG. 1c depicts a differential used in vehicles to influence torque and wheel speed. The differential housing 13 comprises conductive loaded resin-based material. FIG. 1d illustrates a vehicle starter mechanism wherein the housing 14 comprises conductive loaded resin-based material according to the present invention. Referring now to FIG. 1e, an air conditioner compressor is shown. The housing 16 for this device comprises conductive loaded resin-based material. FIG. 1f illustrates an air conditioner dryer wherein the case 18 is fabricated of conductive loaded resin-based material according to the present invention. A water pump for vehicle applications is illustrated in FIG. 1g. The water pump housing 20 comprises conductive loaded resin-based material. FIG. 1h depicts an oil pump for which the housing 22 is fabricated of conductive loaded resin-based material. Additionally, FIG. 1i illustrates valve covers 24 comprising conductive loaded resin-based material. Because of the sound absorbing quality of conductive loaded resin-based material, this engine valve cover 24 absorbs sound generated by the engine thus creating a quieter engine compartment environment.

The illustrated embodiments show the type of vehicle housings and covers which benefit from the advantages of conductive loaded resin-based material. However, other vehicle housings or covers, not illustrated, fall within the scope of the present invention. The advantages of thermal conductivity, weight savings, economic fabrication, electrical grounding, ability to be plated, strength, chemical resistance and corrosion resistance as described apply to many vehicular applications.

Figure 1J:
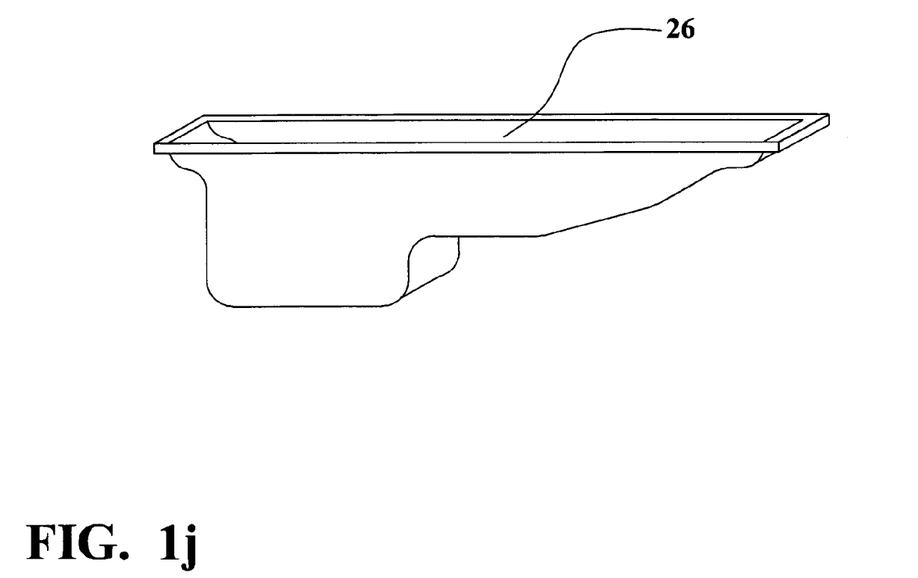
FIG. 1j illustrates a tenth preferred embodiment of the present invention showing an exemplary oil pan and transmission pan formed of conductive loaded resin-based material.

FIG. 1j illustrates yet another preferred embodiment of the present invention. In this case, an oil pan 26 and transmission pan 27 both comprising conductive loaded resin-based material are shown. The conductive loaded resin-based material oil pan 26 and transmission pan 27 provide a significant weight savings in comparison to metal pans typically found in the prior art. This is beneficial for increased fuel efficiency. Further, the conductive loaded resin-based material oil pan 26 and transmission pan 27 provide the thermal characteristics and dimensional stability required for this application.

Figure 1K:
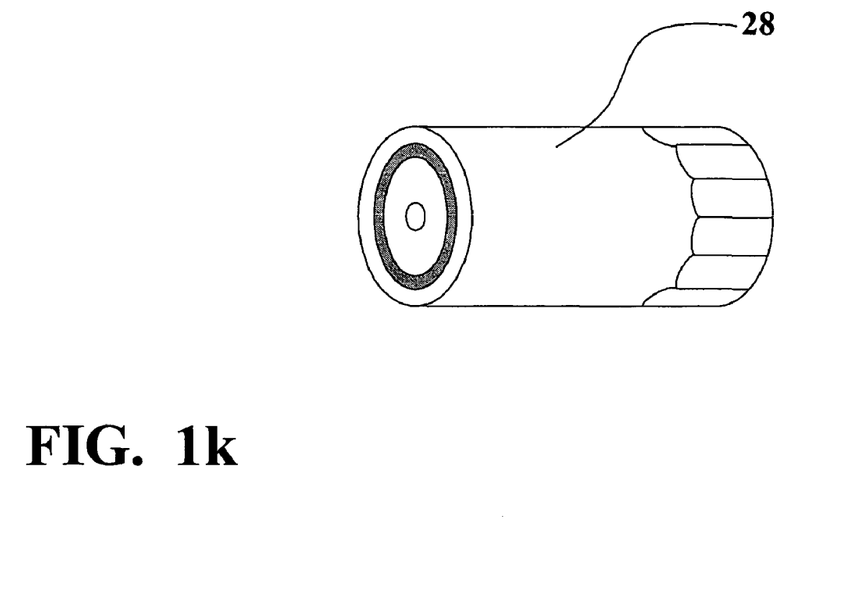
FIG. 1k illustrates an eleventh preferred embodiment of the present invention showing an exemplary oil filter can formed of conductive loaded resin-based material.

FIG. 1k depicts an oil filter can or housing 28 comprising conductive loaded resin-based material according to the present invention. The conductive loaded resin-based material oil filter can 28 is light weight and economical to fabricate. It provides the thermal characteristics and dimensional stability required for this application.

It is understood that the embodiments illustrated in FIGS. 1a through 1k are offered as examples of the types of vehicle housings formed from conductive loaded resin-based material according to the present invention. The present invention also applies to the many additional housings, cases, and covers that encase and/or cover mechanical devices or systems in vehicles. In general, any mechanical housing historically formed of metal can be formed using the novel conductive loaded resin-based material of the present invention.

Figure 2:
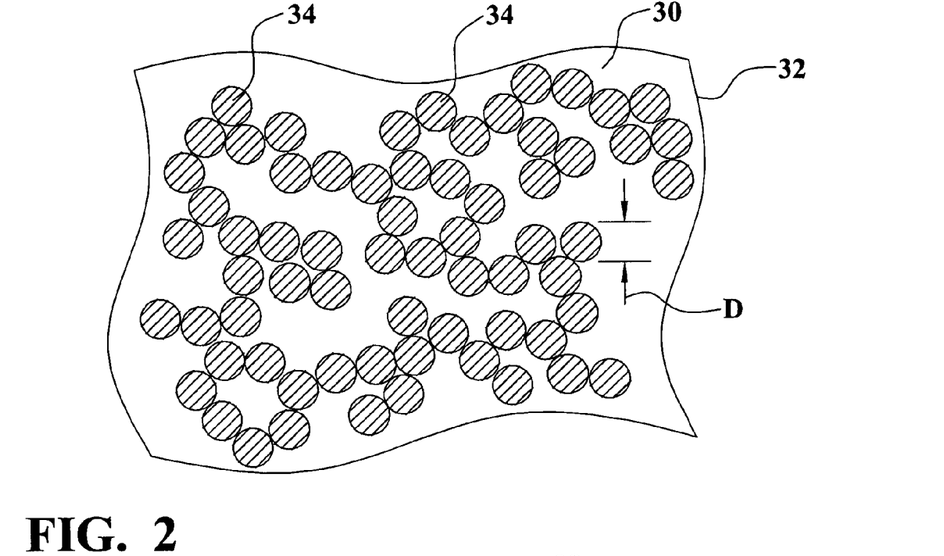
FIG. 2 illustrates a first preferred embodiment of a conductive loaded resin-based material wherein the conductive materials comprise a powder.

The conductive loaded resin-based material of the present invention typically comprises a micron powder(s) of conductor particles and/or in combination of micron fiber(s) substantially homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
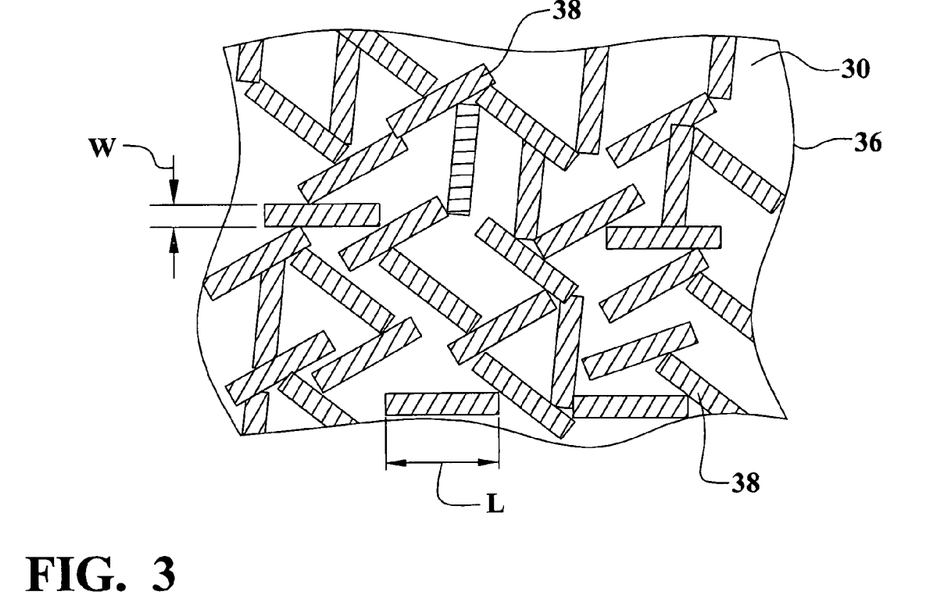
FIG. 3 illustrates a second preferred embodiment of a conductive loaded resin-based material wherein the conductive materials comprise micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The micron conductive fibers 38 may be metal fiber or metal plated fiber. Further, the metal plated fiber may be formed by plating metal onto a metal fiber or by plating metal onto a non-metal fiber. Exemplary metal fibers include, but are not limited to, stainless steel fiber, copper fiber, nickel fiber, silver fiber, aluminum fiber, or the like, or combinations thereof. Exemplary metal plating materials include, but are not limited to, copper, nickel, cobalt, silver, gold, palladium, platinum, ruthenium, and rhodium, and alloys of thereof. Any platable fiber may be used as the core for a non-metal fiber. Exemplary non-metal fibers include, but are not limited to, carbon, graphite, polyester, basalt, man-made and naturally-occurring materials, and the like. In addition, superconductor metals, such as titanium, nickel, niobium, and zirconium, and alloys of titanium, nickel, niobium, and zirconium may also be used as micron conductive fibers and/or as metal plating onto fibers in the present invention.

Figure 4:
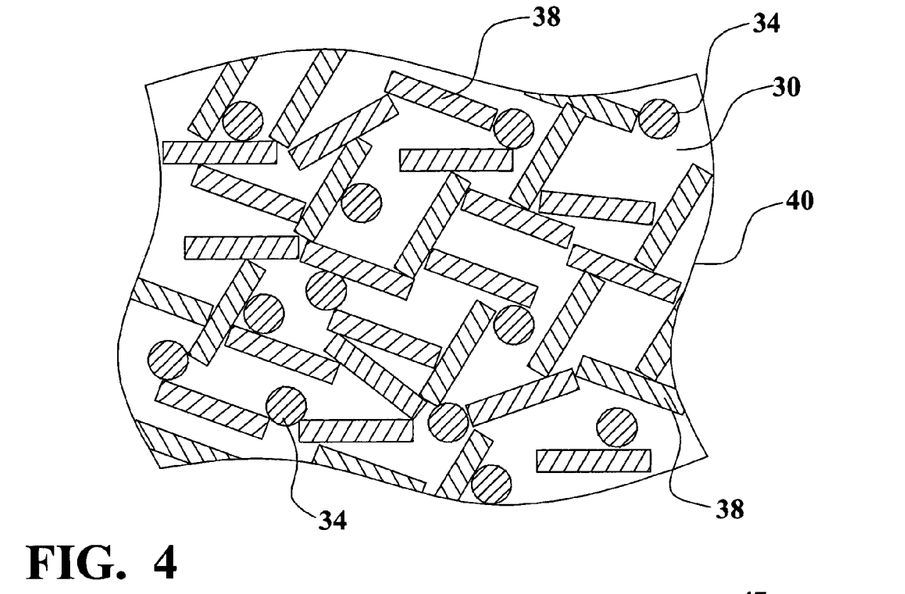
FIG. 4 illustrates a third preferred embodiment of a conductive loaded resin-based material wherein the conductive materials comprise both conductive powder and micron conductive fibers.

These conductor particles and/or fibers are substantially homogenized within a base resin. As previously mentioned, the conductive loaded resin-based materials have a sheet resistance between about 5 and 25 ohms per square, though other values can be achieved by varying the doping parameters and/or resin selection. To realize this sheet resistance the weight of the conductor material comprises between about 20% and about 50% of the total weight of the conductive loaded resin-based material. More preferably, the weight of the conductive material comprises between about 20% and about 40% of the total weight of the conductive loaded resin-based material. More preferably yet, the weight of the conductive material comprises between about 25% and about 35% of the total weight of the conductive loaded resin-based material. Still more preferably yet, the weight of the conductive material comprises about 30% of the total weight of the conductive loaded resin-based material. Stainless Steel Fiber of 6-12 micron in diameter and lengths of 4-6 mm and comprising, by weight, about 30% of the total weight of the conductive loaded resin-based material will produce a very highly conductive parameter, efficient within any EMF, thermal, acoustic, or electronic spectrum. Referring now to FIG. 4, another preferred embodiment of the present invention is illustrated where the conductive materials comprise a combination of both conductive powders 34 and micron conductive fibers 38 substantially homogenized together within the resin base 30 during a molding process.

Figure 5A:
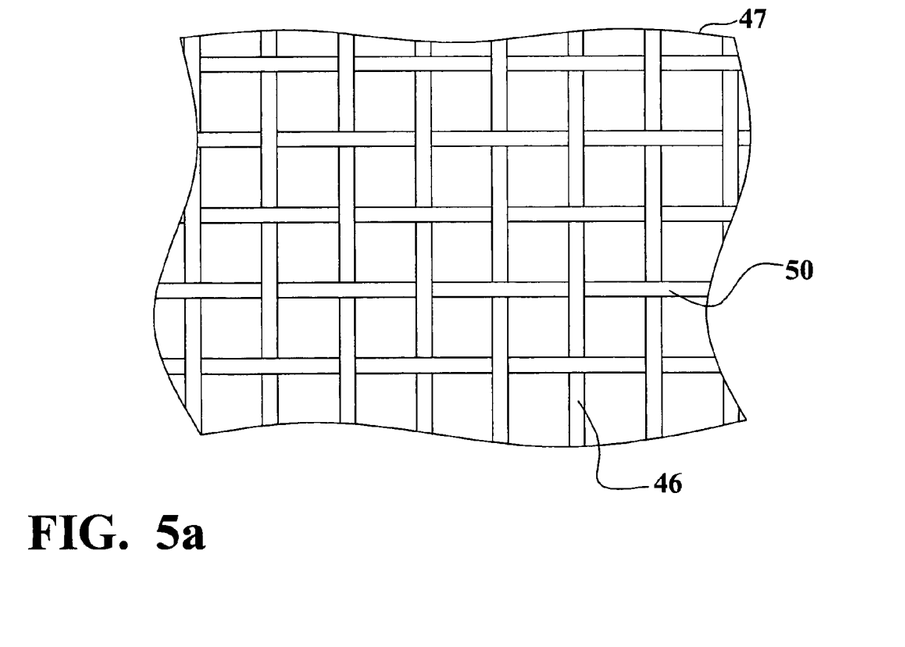
FIGS. 5a and 5b illustrate a fourth preferred embodiment wherein conductive fabric-like materials are formed from the conductive loaded resin-based material.
Figure 5B:
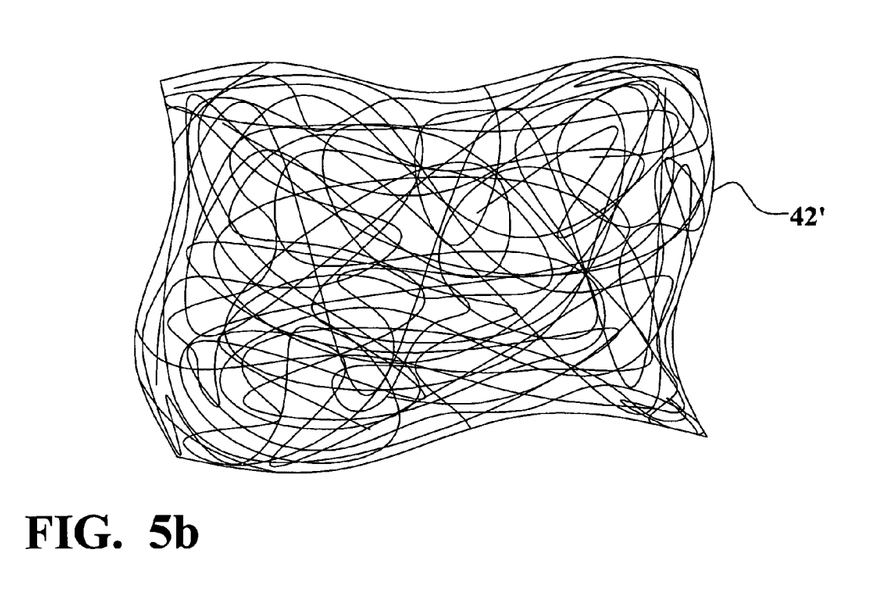

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Figure 6A:
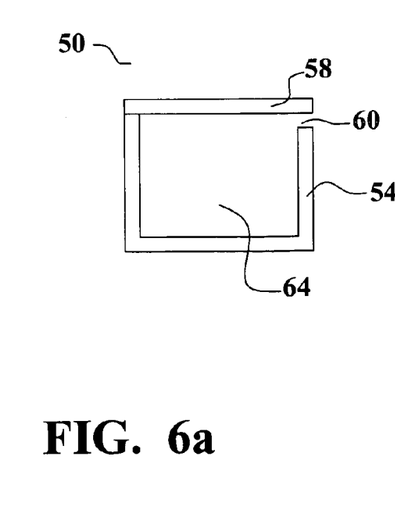
FIGS. 6a and 6b illustrate, in simplified schematic form, an injection molding apparatus and an extrusion molding apparatus that may be used to mold an automotive housing or case of a conductive loaded resin-based material.

Automotive housings formed from conductive loaded resin-based materials can be formed or molded in a number of different ways including injection molding, extrusion, calendaring, or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the substantially homogenized conductive material cures by thermal reaction. The upper portion 58 and lower portion 54 of the mold are then separated or parted and the automotive housings are removed.

Figure 6B:
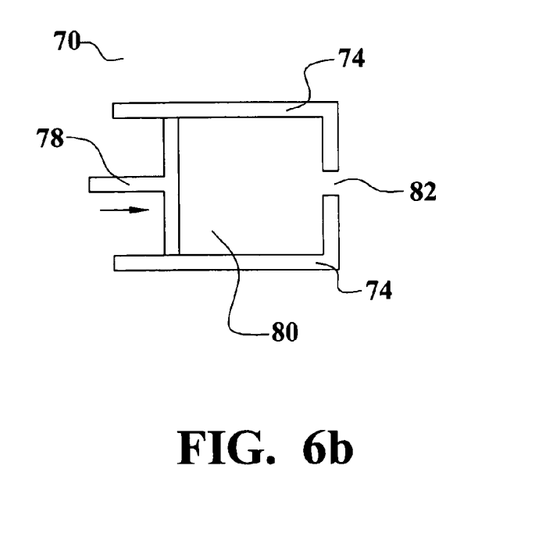

FIG. 6b shows a simplified schematic diagram of an extruder 70 for forming automotive housings using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use. Thermoplastic or thermosetting resin-based materials and associated processes may be used in molding the conductive loaded resin-based articles of the present invention.

The advantages of the present invention may now be summarized. An effective automotive component housing, case, or cover is achieved. A method to form an automotive housing, case, or cover is achieved. The thermal or electrical characteristics can be altered or the visual characteristics can be altered by forming a metal layer over the conductive loaded resin-based material. The automotive housings, cases, and covers have reduced weight, reduced manufacturing cost, and excellent thermal and electrical conductivity.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form a vehicle component device, said method comprising:
   providing a conductive loaded, resin-based material consisting of micron conductive fiber in a resin-based host wherein said micron conductive fiber has a diameter of between 3 µm and 12 µm and a length of between 2 mm and 14 mm; and
   molding said conductive loaded, resin-based material into a vehicle component device comprising:
      providing a mechanical apparatus; and
      molding a housing surrounding said mechanical apparatus wherein said housing comprises said conductive loaded resin-based material.

2. The method according to claim 1 wherein the percent by weight of said micron conductive fiber is between about 20% and about 50% of the total weight of said conductive loaded resin-based material.

3. The method according to claim 1 wherein said micron conductive fiber is metal.

4. The method according to claim 1 wherein said micron conductive fiber is a non-conductive material with metal plating.

5. The method according to claim 1 wherein said step of molding a housing comprises:
   injecting said conductive loaded, resin-based material into a mold;
   curing said conductive loaded, resin-based material; and
   removing said vehicle component device from said mold.

6. A method to form a vehicle component device, said method comprising:
   providing a conductive loaded, resin-based material consisting of micron conductive fiber in a resin-based host wherein the percent by weight of said micron conductive fiber is between 20% and 40% of the total weight of said conductive loaded resin-based material; and
   molding said conductive loaded, resin-based material into a vehicle component device comprising:
      providing a mechanical apparatus; and
      molding a housing surrounding said mechanical apparatus wherein said housing comprises said conductive loaded resin-based material.

7. The method according to claim 6 wherein said micron conductive fiber is nickel plated carbon micron fiber, stainless steel micron fiber, copper micron fiber, silver micron fiber or combinations thereof.

8. The method according to claim 6 further comprising forming a metal layer overlying said conductive loaded resin-based material.

9. The method according to claim 6 wherein said micron conductive fiber is a ferromagnetic material.

10. A method to form a vehicle component device, said method comprising:
    providing a conductive loaded, resin-based material consisting of micron conductive fiber in a resin-based host wherein the percent by weight of said micron conductive fiber is between 20% and 50% of the total weight of said conductive loaded resin-based material and wherein said micron conductive fiber has a diameter of between 3 µm and 12 µm and a length of between 2 mm and 14 mm; and
    molding said conductive loaded, resin-based material into a vehicle component device comprising:
       providing a mechanical apparatus; and
       molding a housing surrounding said mechanical apparatus wherein said housing comprises said conductive loaded resin-based material.

11. The method according to claim 10 wherein said micron conductive fiber is stainless steel.

12. The method according to claim 10 wherein said micron conductive fiber is a non-conductive core material with metal plating.

* * * * *